United States Patent [19]

Makosch et al.

[11] Patent Number: 4,764,014
[45] Date of Patent: Aug. 16, 1988

[54] INTERFEROMETRIC MEASURING METHODS FOR SURFACES

[75] Inventors: Günter Makosch, Sindelfingen; Franz J. Schedewie, Boeblingen, both of Fed. Rep. of Germany

[73] Assignee: International Business Machines Corporation, Armonk, N.Y.

[21] Appl. No.: 91,315

[22] Filed: Aug. 31, 1987

Related U.S. Application Data

[63] Continuation of Ser. No. 908,951, Sep. 17, 1986, abandoned, which is a continuation of Ser. No. 563,714, Dec. 20, 1983, abandoned.

[30] Foreign Application Priority Data

Dec. 20, 1982 [EP] European Pat. Off. ...... 82111809.8

[51] Int. Cl.$^4$ .............................................. G01B 9/02
[52] U.S. Cl. .................................. 356/351; 356/356; 356/363
[58] Field of Search ............... 356/351, 356, 359, 363, 356/400, 401

[56] References Cited

U.S. PATENT DOCUMENTS 4,188,122  2/1980  Massie et al. ................... 356/349
4,358,201  11/1982  Makosch ........................... 356/351

FOREIGN PATENT DOCUMENTS 21148    1/1981   European Pat. Off. .
2518047  11/1975  Fed. Rep. of Germany .
520507   10/1976  U.S.S.R. ........................... 356/360

OTHER PUBLICATIONS

Denby et al., "Plane-Surface Strain Examination by Speckle-Pattern Interferometry Using Electronic Processing", *J. Strain. Anal.* vol. 9, No. 1, pp. 17-25 1/74.
Makosch et al., "Automatic Evaluation of Interference Patterns", *IBM Tech. Discl. Bull.*, vol. 24, No. 5, pp. 2660-2662, 10/81.

*Primary Examiner*—Davis L. Willis
*Assistant Examiner*—Matthew W. Koren
*Attorney, Agent, or Firm*—Jackson E. Stanland

[57] ABSTRACT

A surface to be tested is illuminated with two beams polarized perpendicularly to each other, extending symmetrically to an optical axis and focussed on the surface by a lens. The light scattered at the surface is separated from the directly reflected light by a reflecting diaphragm, and by means of electro-optical compensation (with an electro-optical modulator and photodetector) the scattered light is tested for phase difference which is a function of the distance of a scattering element of the surface from the optical axis. The phase difference within the illuminated spot is a unique function of the distance of the scattering element from the optical axis, if a diffraction-limited optical system is used.

19 Claims, 6 Drawing Sheets

INTERFEROMETRIC MEASURING METHODS FOR SURFACES

This is a continuation of Ser. No. 06/908,951 filed Sept. 17, 1986, now abandoned which is a continuation of Ser. No. 06/563,714 filed Dec. 20, 1983, now abandoned.

DESCRIPTION

1. Technical Field

The invention relates to an interferometric measuring method and more particularly to a method for testing the topography and structure of surfaces wherein the phase of scattered light from the surface is used to determined distances or the absolute position of a point on the surface relative to an optical axis, and to devices for implementing this method.

2. Background Art

For many technical and scientific applications, the topography and the structure of surfaces have to be tested at high resolution and evaluated. Particularly important are photolithographic applications for which the position of edges in masks has to be accurately determined down to fractions of a micrometer.

Optical methods and, in particular, interference methods are particularly suitable for such applications because of their high degree of accuracy. Thus, for example, European Patent Application No. 21 148 (U.S. counterpart U.S. Pat. No. 4,358,201) describes an interferometric measuring method which may be used to test the position of edges or, more generally, the topography of a surface. The actual measuring signal is derived by means of a sensitive phase measuring method from superimposed light beams interfering with each other. However, this method is not suitable for testing surfaces, whose structure is represented without any height differences as points of different scattering power in one plane. This also holds for the interferometric surface measuring method described in German Offenlegungsschrift No. 2 518 047 (U.S. counterpart U.S. Pat. No. 3,958,884).

For testing smooth surfaces, the prior art does not provide for phase but for intensity measurements of the reflected or scattered light. If distances or the absolute position of points relative to the optical axis of the test system are to be determined during such tests, a relative movement between the test light beams and the surface is necessary according to the prior art.

A further disadvantage of methods using intensity measurements is the limited accuracy during evaluation. The absolute magnitude of intensity signals depends, on the one hand, on a plurality of parameters which in most cases are not accurately known and, on the other, on the fact that these signals are often highly non-linear. For measuring, for example, the light reflected or scattered when an edge is crossed, the output signal in step-shaped or, in the case of a dark-field device, takes the form of a pulse. A particular point of the curve thus obtained is generally used to define the exact location of the edge. But the position of this point cannot be accurately determined or can be determined only after further signal processing, and it is only under ideal conditions that this point and the actual position of the edge coincide.

Therefore, it is an object of the present invention to provide a novel measuring method of the above-described kind, by means of which the position of scattering points on a plane surface can be measured very accurately and without moving the optical measuring system and the surface relative to each other. In addition, it is an object of this invention to provide non-elaborate and inexpensive devices for implementing this method.

DISCLOSURE OF INVENTION

According to the proposed measuring method, a scattering structure (e.g., the "edge" between two regions with different optical characteristics) is illuminated by two light beams symmetrically incident with respect to the optical axis of the test system. The scattered waves produced by the two input beams at the scattering structure have a mutual phase difference which is directly proportional to the distance of the scattering element from the optical axis. By means of a highly sensitive method known in the art for measuring the phase difference between two scattered waves, this distance can be determined with very great precision. The resultant output signal is strictly linear and thus can be accurately interpreted.

The device used to implement the method operates on the principle of dark-field illumination and evaluates only the light scattered from the scattering structure (and not the directly reflected light) for phase measurement. The design of this device is relatively simple.

The proposed method permits the very accurate measurement of the absolute position of scattering objects relative to the optical axis, without any relative movement between the optical system and the measuring surface. The expenses in implementing the method and in manufacturing the device are slight. Also, the influence of error sources is minimal, and the measuring speed is high. By simply changing several optical parameters (aperture angle of the beams used, etc.), the measuring device can be adapted to a plurality of measuring jobs. When supplemented by a control system, this method can also be used as a basis for a very accurate positioning system, for example, for photolithographic masks.

These and other objects, features, and advantages will be apparent from the following more particular description of the preferred embodiments.

BRIEF DESCRIPTION OF THE DRAWINGS

FIG. 4A shows another embodiment for implementing the method illustrted in FIG. 1, while FIGS. 4B and 4C show the complementary diaphragms used therein.

BEST MODE FOR CARRYING OUT THE INVENTION

Figure 1:
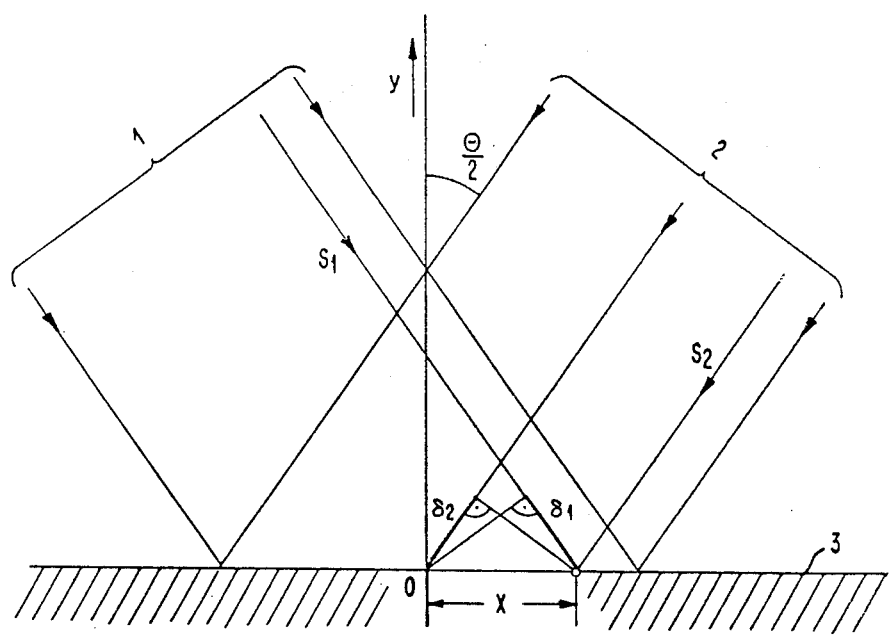
FIG. 1 is a schematic diagram of two superimposed coherent plane waves on a scattering surface, which illustrates the pinciple of the present invention.

FIG. 1 shows two plane waves, coherent to each other, in beams 1, 2, which are symmetric to an axis y (the axis of the optical system), and at an angle with respect to this axis. These beams are incident on the surface 3 of a body to be tested. It is assumed that a scattering point exists on surface 3 at a distance x from axis y. The relative phase position of the two plane waves 1, 2 is assumed to be adjusted such that it has the value 0 at point 0 (the origin of the x-y coordinate system). The spherical waves, emanating from the scattering point x and which are generated by the two rays S1, S2 in the beams 1 and 2, differ from the phase at point 0 according to the geometrical conditions shown in FIG. 1:

$$\rho_1 = -\rho_2 = \frac{2\pi}{\lambda} \cdot x \cdot \sin\frac{\theta}{2} \quad (1)$$

where $\rho_1$ is the phase difference of the scattered wave generated by S1 and $\rho_2$ is the phase difference of the scattered wave generated by S2, with respect to the phase at point 0. The path length differences $\delta_1$, $\delta_2$ are $x \cdot \sin\frac{\theta}{2}$, according to FIG. 1.

Thus, the total phase difference $\Delta\rho$ of the spherical waves scattered at point x is twice that much, namely $$\Delta\rho = \frac{4\pi}{\lambda} \cdot x \cdot \sin\frac{\theta}{2} \quad (2)$$

in the two scattered spherical waves this phase difference remains independent of the direction and the site of observation.

For measuring phase differences, highly sensitive measuring methods (to be described later) are known in the art, these methods having a resolution as high as $\Delta\rho = 6 \cdot 10^{-3}\pi$. At a superposition angle of the two beams of $\theta = 7°$, the measuring accuracy for determining the position of the scattering point x relative to axis y is $$\Delta x = \frac{\lambda}{\pi \cdot \sin\frac{\theta}{2}} \cdot \Delta\rho = 1.5 \cdot 10^{-2} \text{ micrometers,}$$

if a helium-neon laser with a wavelength of $\pi = 0.63$ micrometers is used.

The measuring accuracy can be improved further by increasing the superposition angle $\theta$.

A known method for accurately measuring the phase difference of two beams polarized perpendicularly to each other is described in European Patent Application No. 11 708 (U.S. counterpart U.S. Pat. No. 4,298,283. The two beams (which, in this case, serve to illuminate the surface) are generated and recombined by birefringent optical elements. The phase different is determined by electro-optical compensation. Equivalent measuring methods for phase differences are also known from modern dynamic interferometers.

There is a unique dependence between the phase difference $\Delta\rho$ and the distance x from the optical axis as long as the value of x does not exceed $\pi$; otherwise, a sawtooth curve (FIG. 5B) with the period $$x = \frac{\lambda}{2 \sin\frac{\theta}{2}} \quad (3)$$

is obtained.

For many applications, this many-valuedness is undesirable; for example, it is undesirable in linewidth measurements on photomasks and semiconductor wafers in photolithographic processes. The unique value of the distance from the optical axis can be determined only if the sawtooth curve is traced from the beginning by relatively shifting the surface. This undesired many-valuedness is eliminated by using a diffraction-limited beam path.

Figure 2:
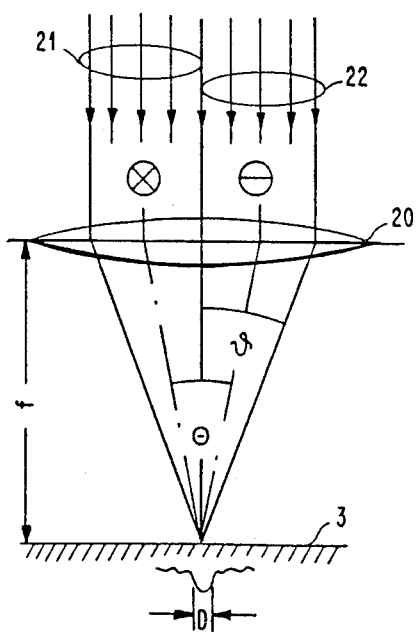
FIG. 2 is a schematic diagram of the beam path for focussed illumination of the scattering surface.

FIG. 2 shows a diffraction-limited beam path preferably used in practice, in which the superposed beams are focussed and the resultant superposition field (focal point) has a diameter D which is smaller than the unique range of equation 2. The condition necessary for this purpose is obtained at the focal point of a focussed laser beam with the aperture angle $\theta$, as, according to the diffraction theory, its diameter D has the value $$D = \frac{\lambda}{2 \cdot \sin\frac{\theta}{2}} = \frac{\lambda}{2 \, N.A.} \quad (4)$$

and thus constitutes an Airy disk (N.A. is the numeric aperture of the optical system 20).

In the case of the beam curve shown in FIG. 2, the two partial beams 21, 22, polarized perpendicularly to each other, touch each other along the optical axis and are focussed at aperture angles $\theta$ onto the surface 3 to be tested, with the center axes of the two partial beams enclosing the angle $\theta$. The beams and thus the angles $\theta$ are relatively small, so that the explanations given with reference to FIG. 1 regarding the phase difference of scattered spherical waves on the basis of plane incident waves also apply in this case.

Figure 5A:
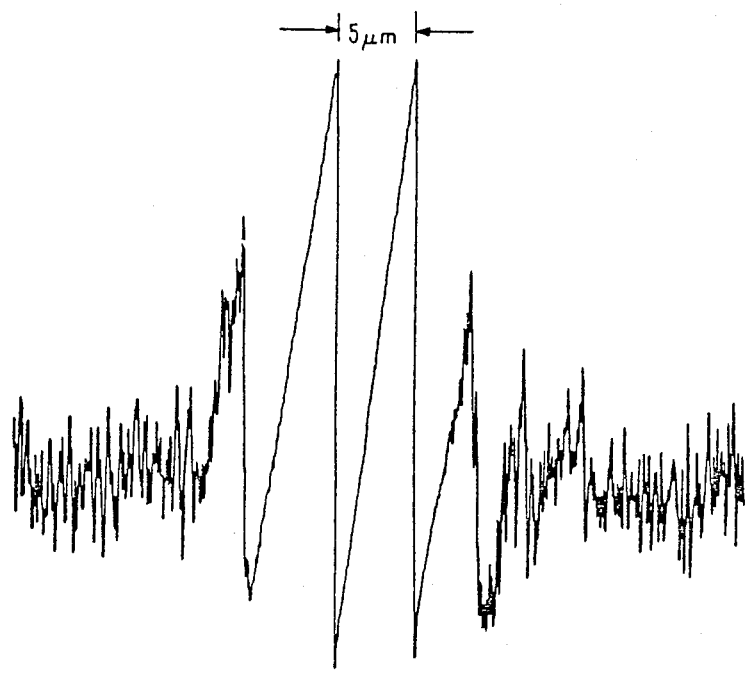
FIGS. 5A and 5B show examples of linear output signals obtained by means of the present invention during the scanning of an edge-shaped structure.

In the arrangement of FIG. 2, if the beam is symmetrically guided to ensure that there is a phase difference of 0 at the center of the focal point 0, then the phase difference measured along the edges of the diffraction disk is $-\pi$ and $+\pi$, respectively. An edge, shifted transversely through the focal point, thus changes the phase difference of the two scattered waves linearly from $-\pi$ to $+\pi$, and the measured value $\Delta\rho = 0$ indicates with great precision the central position of the edge at the focal point. Deviations from this central position can be very accurately determined as a result of the linear signal curve (FIG. 5A). Technically detected resolutions are about $3 \cdot 10^{-3}$ D. As phase measurements can be effected very rapidly (0.1 millisecond or less), an even higher accuracy may be obtained by multiple measurements and by forming the means value.

The use of two beams extending symmetrically to the optical axis prevents any conditions in which unevenness and differences in height of the surface to be tested may lead to a phase difference, falsifying the measuring signal produced as a result of the scattered spherical waves.

Figure 3:
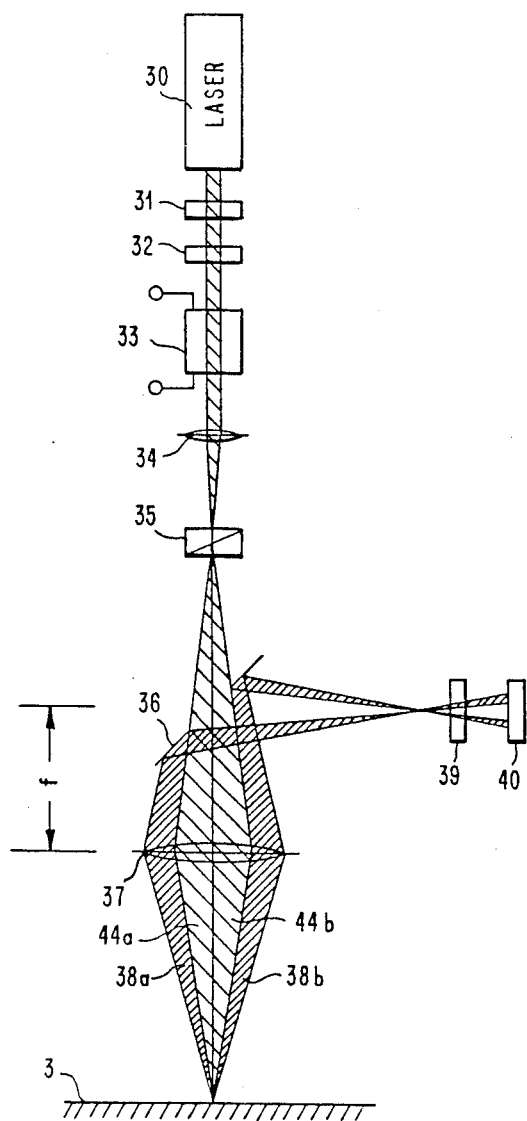
FIG. 3A is an embodiment for implementing the method illustrated in FIG. 1.
FIGS. 3B and 3C are plan and side views of the reflecting mirror used in the embodiment of FIG. 3A for the scattered light.
Figure 3:
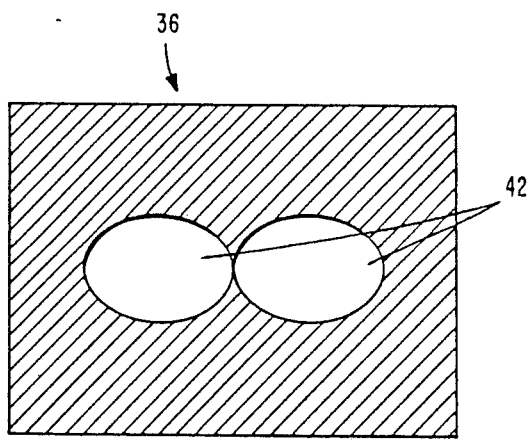
Figure 3:
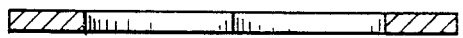

FIG. 3A is a schematic of the design of a device used in practice, in which the phase difference is measured only in scattered light, using the above-mentioned electro-optical compensation method. The surface 3 to be tested is illuminated with the light of a laser 30 which through a $\lambda/2$ plate 31, a polarizer 32, an electro-optical phase modulator 33, and a lens 34 is incident on a Wollaston prism 35, where it is divided into two partial beams (lightly hatched) polarized perpendicularly to each other. These partial beams pass through a reflecting diaphragm 36 and a convergent lens 37 (e.g., a microscope objective), and are incident on the surface 3. The light (heavily hatched beams 38a, 38b) emanating from the scattering structures of the surface 3 is directed, through the reflecting diaphragm 36, onto a polarizer 39 and a photodetector 40, where it is tested with regard to its phase difference using the above-mentioned known method. According to FIGS. 3B (plan view) and 3C (side view) the reflecting diaphragm 36 has elliptical apertures 42 passing the incident light as well as the light regularly reflected at surface 3. By means of the hatched reflecting surfaces, the measuring light is deflected onto the photodetector 40. The device according to FIG. 3A thus permits dark-field observations without any interference by the illuminating light. This effect is obtained if the reflecting diaphragm 36 is positioned in the rear focal plane of the convergent lens 37, thus being imaged onto itself through lens 37 and surface 3.

Figure 4A:
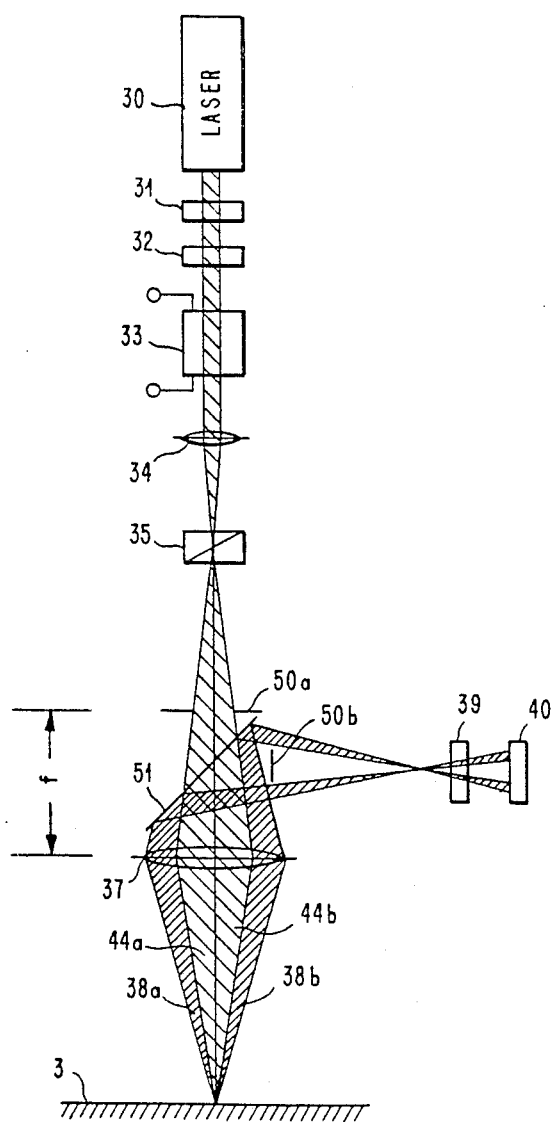
Figure 4:
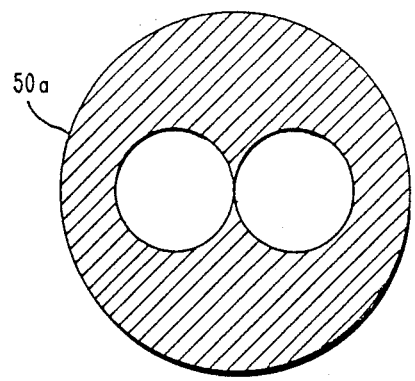
Figure 4:
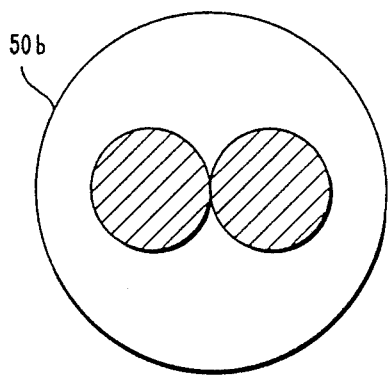

FIG. 4A shows another approach for directing only the light scattered at the surface to the photodetector 40. The same reference numerals are used here as were used in FIG. 3A, whenever possible. For this purpose, complementary diaphragms 50a, 50b are used which are shown enlarged in FIGS. 4B and 4C. In FIGS. 4B and 4C, the hatched elements are opaque. The diaphragm 50a is positioned in the illuminating beam path in the rear focal plane of the convergent lens 37 and the diaphragm 50b is located in the evaluating beam path behind the semireflecting mirror 51 which replaces the reflecting diaphragm 36 of FIG. 4. The device of FIG. 4A requires no elliptical apertures in a reflecting diaphragm, but light losses occur at the divider mirror 51.

Figure 5B:
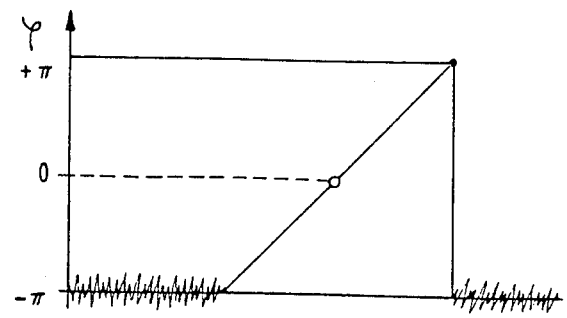

FIGS. 5A, 5B show measuring curves which are obtained by means of the above-described devices. The measuring spot used in FIG. 5A was not diffraction-limited, so a sawtooth curve is obtained if a scattering point is passed underneath the optical axis. In diffraction-limited devices according to equation (4), there are unique measuring signals of the kind schematically represented in FIG. 5B, the phase difference of which increases monotonically as a function of the distance from the optical axis. In this case, the absolute value of the distance of a scattering element from the optical axis can be determined without any relative movement between the test light beams and the surface. The only prerequisite for this is that the focussed light spot impinge upon the scattering element.

For line width measurements or for distance measurements between two lines, the surface 3 is passed underneath the focal spot. The distance between two edges is derived from the sum of the table shift (when an x-y table carrying the specimen to be examined is shifted to pass the two edges underneath the focal spot) and the interferometric phase meauring signal.

The above-described dark-field interference method with phase-sensitive evaluation permits measuring the absolute position of scattering structures on plane surfaces with very great precision, without elaborate means being required. These advantages are attributable to the use of phase measurement, which have been used for the first time in lieu of the intensity measurements that were generally used for this purpose. The measuring accuracy for determining the position of scattering elements is increased by a factor of 300 over the resolution of the optical system.

This measuring method is suitable for all surfaces with scattering elements such as edges, roughnesses, boundary areas between optically different surfaces, etc. An important field of application is so-called resist edges which occur in modern photolithographic processes and which have only slight height differences but strongly different scattering characteristics.

A further application of this method is in testing the straightness of edges and similar scattering structures. For this purpose, the surface is shifted in the direction of the edge, so that for an ideal edge there is no change in its distance from the optical axis, which solely governs the phase direction.

It will be appreciated by those of skill in this art that variations can be made in the practice of this invention, without departing from the spirit and scope thereof.

What I claim as new and desire to secure by Letters Patent is:

1. An interferometric measuring method for testing a surface to determine the distance of a stationary scattering element from an optical axis, comprising the steps of:
    directing two light beams which are inclined to one another and which have mutually perpendicular directions of polarization onto said surface, there being substantially no relative movement between said two light beams and said surface, said two light beams being focussed onto said surface and being symmetrically arranged with respect to an optical axis and providing dark field illumination of said surface,
    determining the static distance of said scattering element from said optical axis by detecting the phase difference of light waves scattered from said scattering element on said surface, said scattered light waves having mutually perpendicular directions of polarization, wherein said phase difference is proportional to the distance of said scattering element from said optical axis.

2. The method of claim 1, wherein said two light beams incident upon said surface extend symetrically to said optical axis and wherein said optical axis is the optical axis of an imaging system producing said two light beams, each of said two light beams illuminating half of a convergent lens arranged at the distance of its focal length from said surface to be tested.

3. The method of claim 1, further including relative motion between said surface to be tested and the imaging system producing said light beams incident upon said surface, for linewidth measurements or distance measurements between two lines.

4. The method of claim 1, including the step of removing light reflected from said surface prior to detection of said phase difference.

5. The method of claim 1, in which a diffraction-limited beam path is used for the two incident light beams, said two light beams being superimposed and focussed onto the surface to be tested.

6. The method of claim 1, wherein said two light beams incident upon said surface are coherent.

7. An interferometric measuring method for testing a surface to determine the static distance of a scattering center from an optical axis, comprising the steps of:
    providing dark field illumination of said surface by directing two beams of light focussed to a scattering center on said surface, said two beams following diffraction limited beam paths and being inclined with respect to each other and having mutually perpendicular directions of polarization, said two beams being symmetrically disposed with respect to an optical axis of an imaging system used to produce said beams, maintaining constant with respect to one another the optical system providing said beams and said surface, removing the light reflected from said scattering center and collecting only the light scattered therefrom, and determining the static distance of said scattering center from said optical axis by measuring the phase difference between the phase of each scattered light wave from said scattering center and the phase of a light wave scattered at the location where said optical axis intersects said surface, said phase difference being a measure of the distance of said scattering center from the location where said optical axis intersects said surface.

8. A device for testing the topography and structure of a surface, comprised of:

an imaging system for providing dark field illumination of said surface by producing two beams of light which are incident upon said surface and focussed to a small spot at a particular location thereof, said two beams having mutually perpendicular directions of polarization and being symmetrically inclined to an optical axis of said imaging system, there being substantially no relative motion between said imaging system and said surface during said testing, means for removing light reflected from said location, means for collecting light scattered from said location, and means for determining the distance of said location from said optical axis, including means for measuring the phase difference between the scattered light waves arising from the incidence of said two beams of light onto said location, said scattered light waves having different directions of polarization, said phase difference being related to the distance of said location from said optical axis.

9. The device of claim 8, wherein said imaging system includes a lens for converging said two beams of light onto said surface.

10. The device of claim 9, where said means for measuring includes electro-optical compensation means.

11. The device of claim 8, where said means for collecting includes a mirror positioned to reflect said scattered light to said means for measuring.

12. The device of claim 8, where said means for collecting includes a beam divider for directing scattered light to said means for measuring.

13. The device of claim 12, where said means for measuring includes electro-optical compensation means.

14. The device of claim 8, where said means for measuring includes electro-optical compensation means.

15. The device of claim 14, where said electro-optical compensation means includes an electro-optical modulator and a polarizer located in the path of said two beams of light, and a polarizer and a photodetector located in the path of said collected scattered light.

16. The device of claim 8, where the paths of said two beams of light incident upon said surface are diffraction limited.

17. The device of claim 8, where said imaging system includes a lens for converging said two beams of light onto said surface, and further including means for separating light scattered from said particular location from the light reflected from said particular location.

18. The device of claim 8, where each of said two beams of incident light produces a scattered light wave, said scattered light waves having mutually perpendicular polarization.

19. A device for testing the topography and structure of a surface, comprised of:

an imaging system for providing dark field illumination of said surface by producing two beams of light which are incident upon said surface at a particular location thereof, said two beams having mutually perpendicular directions of polarization and being symmetrically inclined to an optical axis of said imaging system, there being substantially no relative motion between said imaging system and said surface, means for converging said two beams to a small spot at said particular location, means for separating light scattered from said particular location from the light reflected from said particular location, means for collecting light scattered from said location, and means for determining the distance between said particular location and the location where said optical axis intersects said surface, including means for measuring the phase difference between each scattered wave from said particular location and the phase of a light wave scattered at the location where said optical axis intersects said surface, said phase difference being related to the distance of said location from the location where said optical axis intercepts said surface.

* * * * *